US006278157B1

(12) United States Patent
Tran et al.

(10) Patent No.: US 6,278,157 B1
(45) Date of Patent: Aug. 21, 2001

(54) METHOD AND APPARATUS FOR ELIMINATION OF PARASITIC BIPOLAR ACTION IN LOGIC CIRCUITS INCLUDING COMPLEMENTARY OXIDE SEMICONDUCTOR (CMOS) SILICON ON INSULATOR (SOI) ELEMENTS

(75) Inventors: Jeff Van Tran; Salvatore N. Storino, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/240,991

(22) Filed: Jan. 29, 1999

(51) Int. Cl.[7] .................................................. H01L 29/01
(52) U.S. Cl. .......................... 257/347; 257/347; 257/352; 257/353; 257/360; 257/361
(58) Field of Search ..................................... 257/347, 352, 257/353, 360, 361

(56) References Cited

U.S. PATENT DOCUMENTS

| | | | |
|---|---|---|---|
| 4,893,158 | 1/1990 | Mihara et al. | 357/23.13 |
| 5,627,395 | 5/1997 | Witek et al. | 257/350 |
| 5,742,075 | 4/1998 | Burns et al. | 257/59 |
| 5,748,016 | 5/1998 | Kurosawa | 327/108 |
| 5,770,881 | 6/1998 | Pelella et al. | 257/347 |
| 5,777,491 | 7/1998 | Hwang et al. | 326/113 |
| 5,793,228 | 8/1998 | Evans | 326/98 |
| 5,831,451 | 11/1998 | Bosshart | 326/93 |
| 5,917,355 | 6/1999 | Klass | 327/208 |
| 5,923,071 | 7/1999 | Saito | 257/458 |
| 5,932,914 | 8/1999 | Horiguchi | 257/355 |
| 5,982,006 * | 11/1999 | Joyner | 257/347 |
| 5,985,728 * | 2/2000 | Jennings | 438/311 |
| 5,994,738 * | 11/1999 | Wollesen | 257/347 |
| 6,002,271 | 12/1999 | Chu et al. | 326/98 |
| 6,020,222 * | 2/2000 | Wollesen | 438/149 |
| 6,023,089 * | 2/2000 | Kang | 257/347 |
| 6,028,337 * | 2/2000 | Letavic et al. | 257/347 |
| 6,031,261 * | 2/2000 | Kang | 257/302 |
| 6,034,399 * | 3/2000 | Brady et al. | 257/355 |
| 6,094,072 | 7/2000 | Davies et al. | 326/98 |

FOREIGN PATENT DOCUMENTS

| | | | |
|---|---|---|---|
| 406112483 * | 7/1994 | (JP) | 257/347 |
| 406204440 * | 7/1994 | (JP) | 257/347 |
| 406209109 * | 7/1994 | (JP) | 257/347 |

OTHER PUBLICATIONS

"Pre–Discharge Technique to Improve Noise Immunity on Silicon–on–Insulator (SOI) Domino Circuits", Research Disclosure, Apr. 1998 No. 408, pp. 496–497, Disclosed by International Business Machines Corporation.

U.S. Patent application Ser. No. 09/239,289, by Storino et al., "Method and Apparatus for Elimination of Parasitic Bipolar Action in Logic Circuits for History Removal Under Stack Contention Including CMOS SOI Elements", filed Jan. 29, 1999.

* cited by examiner

*Primary Examiner*—Eddie Lee
*Assistant Examiner*—Edgardo Ortiz
(74) *Attorney, Agent, or Firm*—Merchant & Gould; Roy W. Truelson (57) ABSTRACT

The present invention is an apparatus and method to overcome the unwanted effects of parasitic bipolar discharge in silicon-on-insulator (SOI) field effect transistors (FET) by expanding a stack SOI MOS devices arranged to provide a predetermined logic function. The SOI MOS devices are arranged so as to eliminate electrical connections between certain intermediate nodes of the dynamic logic circuit. Accordingly, eliminating any parasitic bipolar current leakage paths associated with such electrical connections between certain intermediate nodes of said stacked SOI MOS devices of said dynamic circuit.

18 Claims, 5 Drawing Sheets

METHOD AND APPARATUS FOR ELIMINATION OF PARASITIC BIPOLAR ACTION IN LOGIC CIRCUITS INCLUDING COMPLEMENTARY OXIDE SEMICONDUCTOR (CMOS) SILICON ON INSULATOR (SOI) ELEMENTS

BACKGROUND OF THE INVENTION

A. Field of the Invention

The invention relates generally to a method and apparatus for reducing the effects of parasitic bipolar discharge of silicon-on-insulator (SOI) electronic devices More specifically, the invention relates to eliminating the unwanted effect of parasitic bipolar discharge of SOI field effect transistors (FET) in dynamic logic circuits.

B. Description of Related Art

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

In recent years Metal Oxide Semiconductor (MOS) Field Effect Transistor (FET) integrated circuits and Complementary Metal Oxide Semiconductor (CMOS) FETs have gained popularity and are the most widely used type of integrated circuit technology. Today, CMOS electronic devices provide advantages of higher operating speeds, smaller size, lower power consumption, and are increasingly becoming cheaper to manufacture as a result of smaller component size, higher manufacturing production yields per semiconductor wafer, and larger wafer sizes. The most popular integrated circuit devices manufactured utilizing CMOS technology are microprocessors, memory, and digital logic circuits.

Traditional MOS and CMOS semiconductors consist of a metal on an oxide layer that is placed on a silicon substrate. The added impurities in the silicon substrate enable these devices to operate as transistors. On the other hand, SOI semiconductors include a thin layer of silicon placed on top of an insulator, such as silicon oxide or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. Therefore, with SOI technology faster MOS transistors can be manufactured resulting in higher performance semiconductors to fuel emerging needs for faster electronic devices.

SOI technology has several drawbacks. An inherent drawback of placing a MOS transistor on top of a SOI layer is that the MOS transistor is actually placed in parallel with a bipolar junction transistor. If enough current is passed through the MOS transistor, the parasitic bipolar transistor will turn on. This causes an unwanted effect called bipolar discharge and lowers the performance of the MOS transistor.

High speed CMOS circuits often employ a domino circuit technique that utilizes pre-charging to improve the gate speeds of the transistors. Dynamic circuit nodes are pre-charged during each clock cycle to a certain level. The problem with SOI FETs is that the parasitic bipolar transistor causes bipolar discharge. This is undesirable because it causes an unintended loss of charge on the drain nodes of the dynamic circuit.

Normally, parasitic bipolar action does not manifest itself in conventional, bulk, MOS transistors because the base of the bipolar transistor is always kept at ground potential, keeping the bipolar off. In SOI, the body of the MOS FET device, or base of the bipolar transistor, is floating and can be charged high by junction leakages induced when the drain and source terminals of the MOS FET are at a high potential. Subsequently, if the source is pulled to a low potential, the trapped charge in the base area is available as parasitic base current. The parasitic base current activates the bipolar transistor and generates a collector current at the drain terminal of the MOS FET. The unintentional loss of charge could lead to system failure, for example, by erroneously switching logic state.

It will be appreciated by those skilled in the art that a technique for eliminating parasitic bipolar discharge in MOS FET devices can be provided as discussed in U.S. patent application Ser. No. 09/240,244, filed Jan. 29, 1999, and entitled "Method And Apparatus For Elimination Of Parasitic Bipolar Action In Complementary Oxide Semiconductor (CMOS) Silicon On Insulator (SOI) Circuits," the disclosure of which is hereby incorporated herein by reference.

The active discharging device effectively pre-discharges nodes in SOI MOS FET dynamic logic circuits to prevent the parasitic bipolar transistor from activating. However, in some embodiments of dynamic logic gates pre-discharging nodes is not always effective. Under certain input logic signal conditions a "sneak" bipolar leakage current path is created whenever intermediate nodes of the dynamic logic circuit are interconnected.

Figure 3:
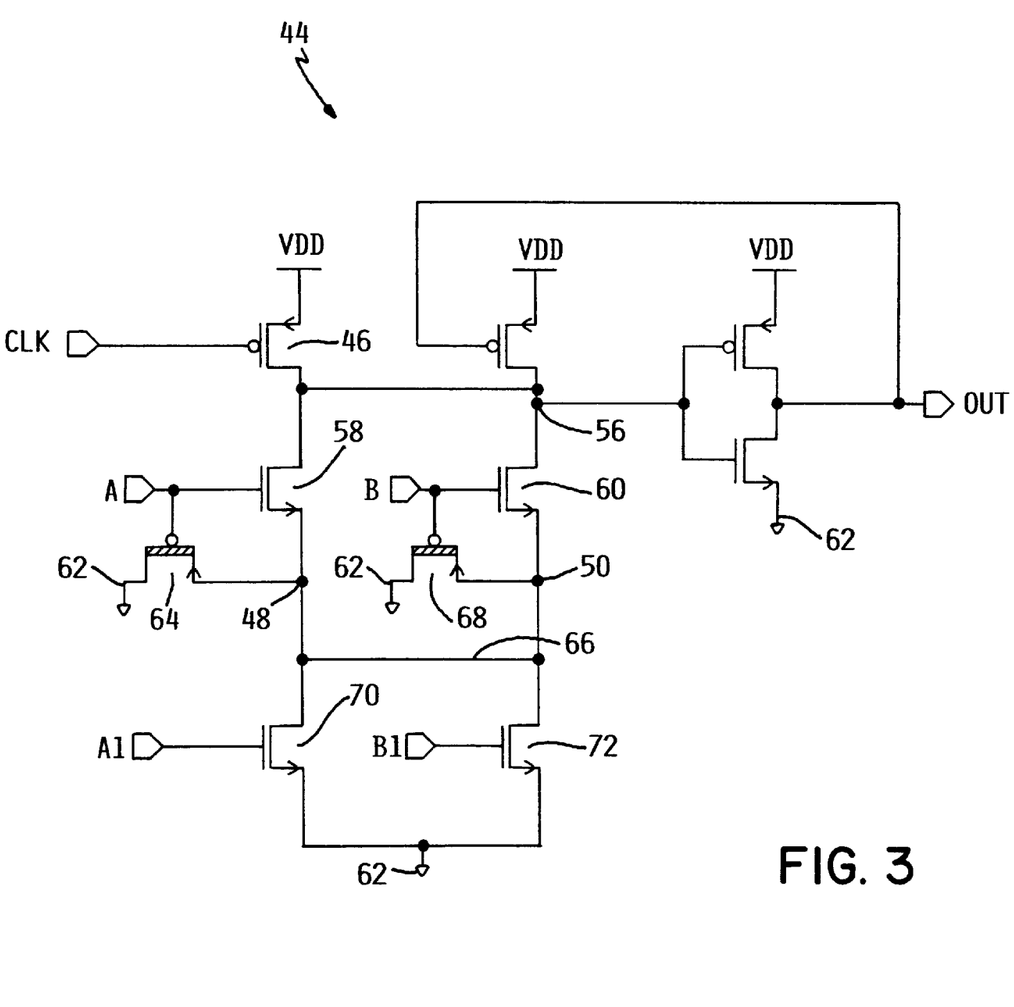
FIG. 3 is a schematic of a pre-discharged SOI dynamic logic circuit schematic diagram including unwanted sneak current discharging path.

FIG. 3 illustrates a pre-discharged SOI domino logic circuit 44 that implements a logic function whose output may be determined according to:

OUT=NOT{(A+B)*(A1+B1)}.

FIG. 3 illustrates but one specific embodiment of a logic circuit. However, it will be appreciated by those skilled in the art that various implementations of logic functions and circuits such as AND, OR, NOR, NAND, EXCLUSIVE-OR, etc. and combinations thereof can be realized that have the characteristics in accordance with those illustrated in FIG. 3, namely a pre-discharged SOI domino logic circuit wherein a sneak current discharge path exists Under certain states of logic inputs A, A1, B and B1, conductive path 66, located between nodes 48 and 50, may discharge transistors 68 or 64 to a circuit common node 62, or ground. In domino circuit 44, as illustrated in FIG. 3, the sneak path exists whenever input A is in a logic low state, B is in a logic high state and A1 and B1 are in logic low states. Given that the clock (CLK) has charged node 56 to a logic high state and is turned off, the sneak path exists from charge loss on node 56 to circuit common (ground) 62 via transistors 60 and 64. Since both A1 and B1 are in a logic low state the domino circuit 44 should not have "evaluated" or discharged node 56. Positive Channel-Field Transistors (PFETs) 64 and 68 were intended to discharge nodes 48 and 50, respectively to disable the bipolar effects of Negative Channel-Field Effect Transistors (NFETs) 58 and 60, respectively. Thus, it can be seen that since there is a conductive path 66 connecting intermediate nodes 48 and 50, the sneak path will provide a parasitic bipolar discharge path between intermediate nodes 48 and 50 of the dynamic logic circuit 44.

As a result, it can be seen that there is a need to minimize the effect of parasitic bipolar transistors in parallel with MOS transistors in dynamic logic circuits.

Moreover, it can also be seen that there is a need to eliminate parasitic bipolar action in dynamic logic circuits with at least one set of interconnected intermediate nodes that provide a current leakage path.

SUMMARY OF THE INVENTION

The present invention relates generally to a method and apparatus for reducing the effects of parasitic bipolar discharge of silicon-on-insulator (SOI) devices. More specifically, the present invention relates to eliminating the unwanted effect of parasitic bipolar discharge of SOI field effect transistors (FET) in dynamic logic circuits where pre-discharging of nodes will not be effective because a sneak path exists under certain dynamic logic circuit input conditions.

In accordance with a preferred embodiment, the present invention provides an apparatus and method to overcome the unwanted effects of parasitic bipolar discharge in silicon-on-insulator (SOI) field effect transistors (FET) by expanding a stack of SOI MOS devices arranged to provide a predetermined logic function. The SOI MOS devices are arranged so as to eliminate electrical connections between certain intermediate nodes of the dynamic logic circuit. Accordingly, eliminating any parasitic bipolar current leakage paths associated with such electrical connections between certain intermediate nodes of said stacked SOI MOS devices of said dynamic circuit.

In one embodiment, the present invention provides an apparatus with reduced bipolar transistor action including a dynamic logic circuit and a Silicon on Insulator(SOI) Metal Oxide Semiconductor (MOS) device. The apparatus comprises a plurality of stacked SOI MOS devices interconnected to perform a predetermined logic function defining a shared node and a plurality of intermediate nodes; and a plurality of active discharging devices interconnected between said intermediate nodes and any one of corresponding inputs to said stacked SOI MOS devices; wherein said plurality of stacked SOI MOS devices are arranged so as to eliminate any parasitic bipolar transistor current leakage path.

In another embodiment, the present invention provides, a method of providing an apparatus with reduced bipolar transistor action including a dynamic logic circuit and a Silicon on Insulator(SOI) Metal Oxide Semiconductor (MOS) device. The method comprises providing a plurality of stacked SOI MOS devices interconnected to perform a predetermined logic function defining a shared node and a plurality of intermediate nodes; providing a plurality of active discharging devices interconnected between said intermediate nodes and any one of corresponding inputs to said stacked SOI MOS devices; and arranging said plurality of stacked SOI MOS devices so as to eliminate any parasitic bipolar transistor current leakage path.

In yet another embodiment, the present invention provides a method of eliminating parasitic bipolar transistor action in an apparatus including a dynamic logic circuit performing a predetermined logic output function. The dynamic logic circuit further including a plurality of Silicon on Insulator (SOI) Metal Oxide Semiconductor (MOS) devices and the dynamic logic circuit defining a plurality of interconnected intermediate nodes providing an electrical conductive path between the intermediate nodes. The method comprises providing a stack expansion of a plurality of said SOI MOS devices; eliminating said conductive path between said nodes coupling said SOI MOS devices; and maintaining said predetermined logic output function; whereby said parasitic bipolar action of said SOI MOS devices are deactivated.

These and various other features and advantages of the present invention will become readily apparent to those skilled in the art from the following detailed description and corresponding drawings. As will be realized, the invention is capable of modification without departing from the invention. Accordingly, the drawing and description are to be regarded as being illustrative in nature, and not as restrictive.

DETAILED DESCRIPTION OF THE ILLUSTRATED EMBODIMENTS

The illustrated embodiment of the invention is directed to reducing or eliminating the unwanted effects of the parasitic bipolar transistor in silicon-on-insulator (SOI) field effect transistor (FET) dynamic logic circuits. The dynamic logic circuit may have an input, an output, a clock, and a plurality of stacked SOI Metal Oxide Semiconductor (MOS) FETs interconnected to perform logic functions defining a shared node, said shared node coupled to a pre-charging device, a plurality of intermediate nodes having a corresponding input coupled to said stacked transistors; and a plurality of active discharging transistors interconnected between said intermediate nodes and any one of said corresponding input to said stacked transistors. The discharging devices actively discharge the intermediate nodes of the stacked SOI FETs during the pre-charge phase of dynamic logic circuits, whereby the parasitic bipolar transistor is deactivated and the charge on the shared node is maintained at a high potential level during the pre-charge phase of dynamic logic circuits.

However, in certain logic configurations a sneak current discharging path may be present whereby the intermediate nodes of the stacked SOI FETs are discharged during the pre-charge phase of dynamic logic circuits via a sneak current discharging path to a circuit common or ground. Accordingly, the illustrated embodiment is directed at eliminating the sneak current discharging path by applying a stack expansion methodology to realize the dynamic logic circuit.

Figure 1:
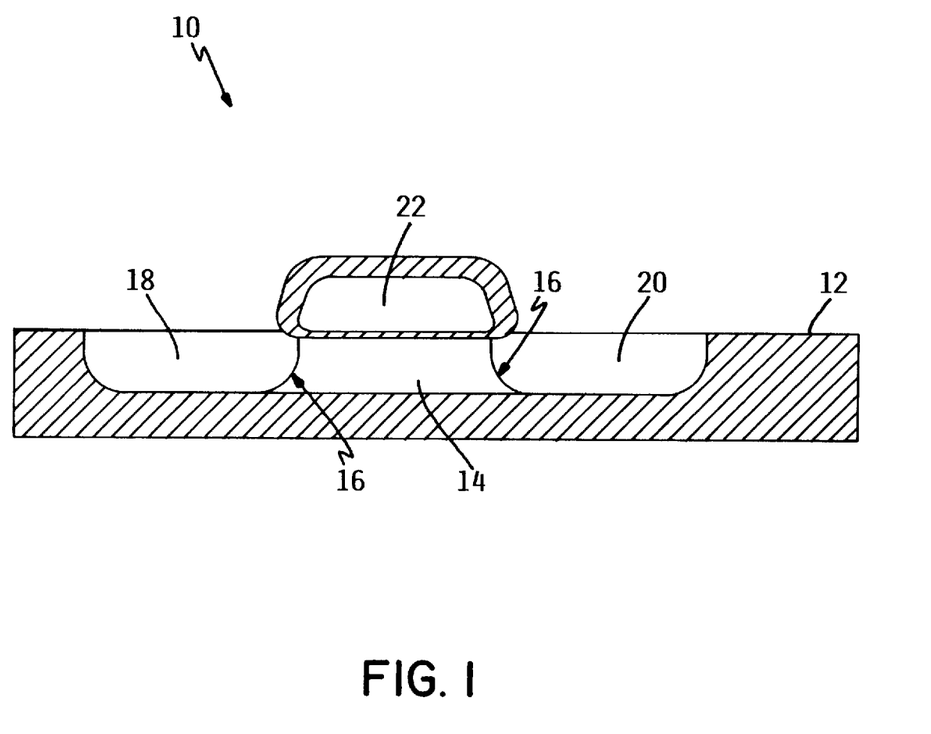
FIG. 1 is a cross sectional diagram of a silicon-on-insulator (SOI) field effect transistor (FET) and a parasitic bipolar transistor.

FIG. 1 illustrates a cross sectional view of a silicon-on-insulator (SOI) negative field effect transistor (NFET) 10 and a parasitic bipolar transistor. The NFET 10 is built on a silicon dioxide, i.e. glass, insulating layer 12. In bulk (non SOI) the base region of the parasitic bipolar transistor is always maintained at ground potential. Therefore, no base current is generated and no resulting collector current flows through the bipolar device.

However, in SOI transistors, the body of the FET device 14, or base region of the parasitic bipolar transistor, which lies beneath the gate 22 of the NFET, is floating. The body 14 of the transistor can become charged to a high potential by junction 16 leakage induced whenever both the drain 18 and source 20 terminals are at a high potential. In this illustration the drain 18 of the NFET is the n+ or collector region of the parasitic bipolar and the source 20 is the n+ or emitter region of the parasitic bipolar.

If the body 14 of the FET charges to a high potential and the source 20 is pulled to a low potential, the trapped charge in the body 14, or base region, becomes available as parasitic base current. If the parasitic base current is of sufficient magnitude it will activate the parasitic bipolar transistor and thus generate a collector current at the drain 18. The collector current, flowing in parallel with the drain 18 current, is undesirable as it causes a loss of charge at the drain 18 node of the dynamic circuit.

Figure 2:
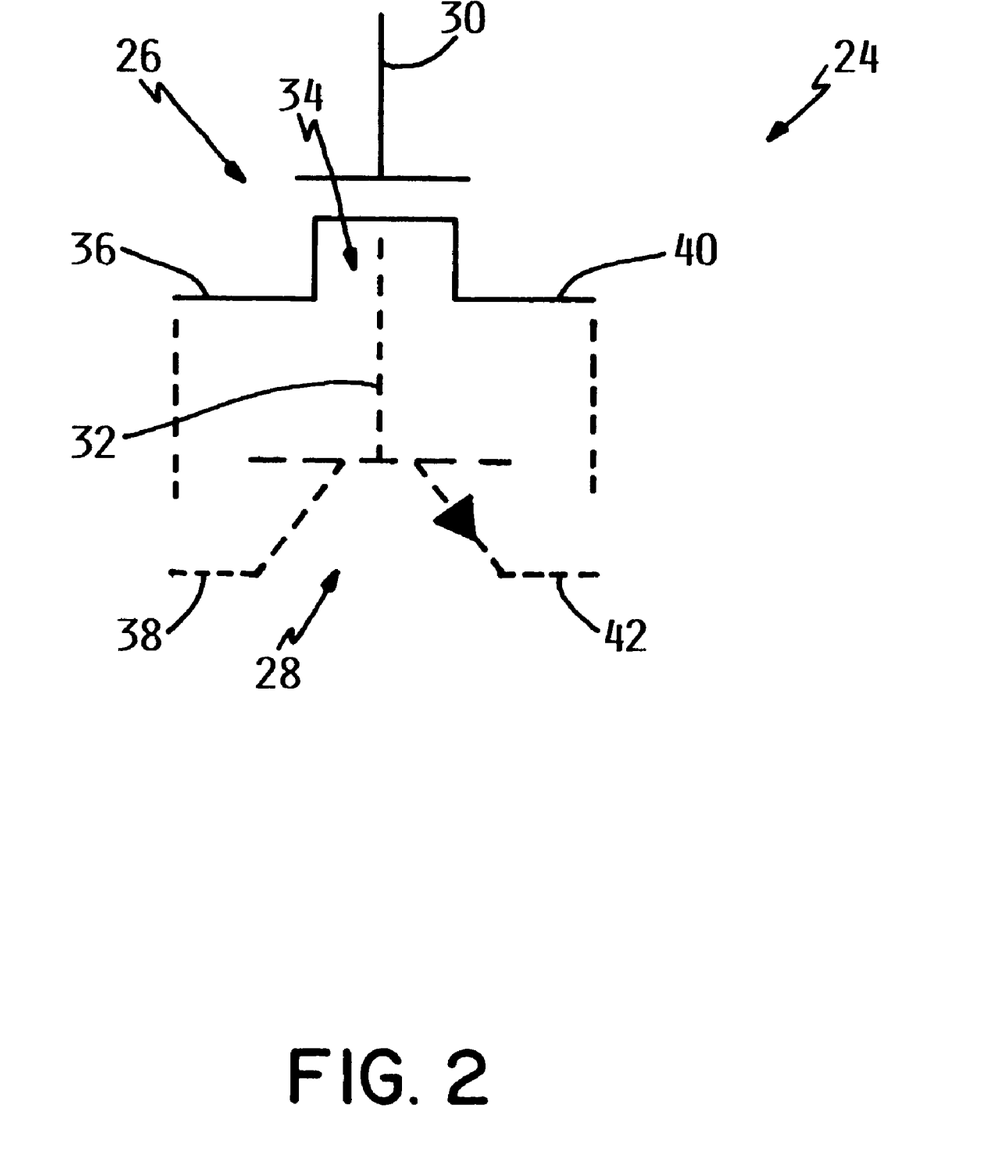
FIG. 2 is an equivalent schematic diagram of the SOI field effect transistor FET and bipolar transistor.

FIG. 2 illustrates an equivalent schematic diagram 24 of the SOI field effect transistor NFET 26 and the parallel parasitic bipolar NPN transistor 28. NFET 26 also includes gate terminal 30. The drain 36 of NFET 26 is equivalent to the collector 38 of the parasitic bipolar transistor 28. Accordingly, the source 40 of NFET 26 is equivalent to the emitter 42 of the parasitic bipolar transistor 28. The body 34 of NFET 26 becomes charged by induced leakage whenever the drain 36 and source 40 terminals are held at a high potential. If the source 40 is dropped to a low potential the trapped charged in the body 34 causes a current to flow from the base 32 of the parasitic bipolar transistor 28. This causes a current to flow in the collector 38 that is parallel to a current flowing in the drain 36. This action discharges the drain 36 node of a dynamic circuit.

Figure 4:
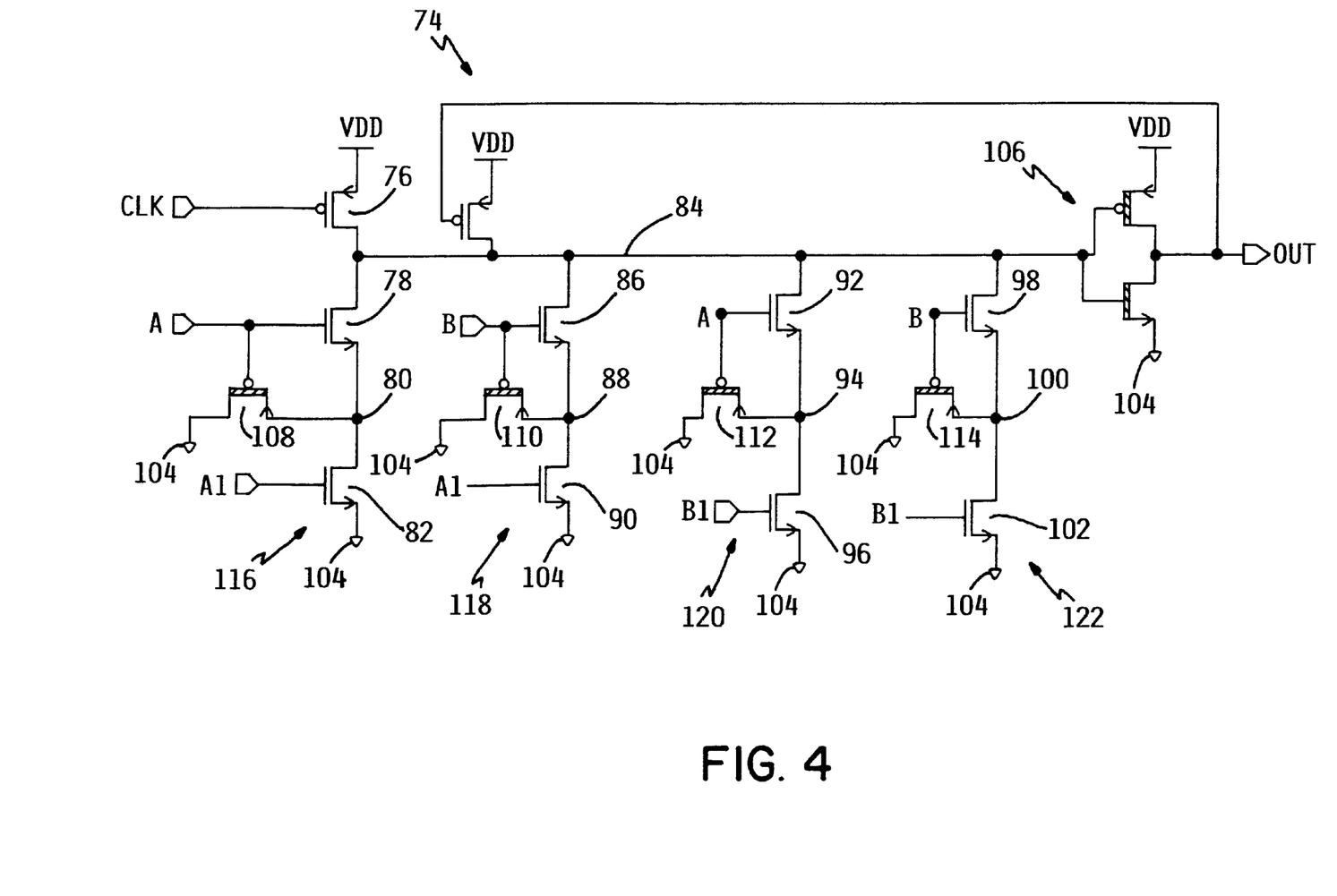
FIG. 4 is a schematic diagram of a dynamic circuit stack expansion methodology to eliminate the sneak current discharging path.

FIG. 4 is a schematic diagram of a dynamic logic circuit 74 illustrating one embodiment of the present invention. Dynamic logic circuit 74 eliminates the unwanted sneak current leakage path from pre-discharging transistors 68 (FIG. 3) or 64 (FIG. 3) through conductive path 66 (FIG. 3) to a logic circuit common node 62 (FIG. 3) under certain states of logic inputs A, A1, B and B1 (all in FIG. 3).

In one embodiment the present invention provides a dynamic circuit 74 that eliminates unwanted sneak current path created by conductive path 66 (FIG. 3) by expanding a first transistor stack circuit comprised of transistors 58 (FIG. 3) and 70 (FIG. 3), and a second transistor stack circuit comprised of transistors 60 (FIG. 3) and 72 (FIG. 3).

The stack expansion methodology is utilized to expand the dynamic circuit as illustrated in FIG. 3 into four separate transistor stacks 116, 118, 120 and 122, thereby eliminating conductive path 66 (FIG. 3). Transistor stack 116 is comprised of NFET transistors 78 and 82, defining an intermediate node 80 where the source of transistor 78 is electrically connected to the drain of transistor 82. PFET transistor 108 also has its source electrically connected to node 80. PFET transistor 108 discharges node 80 to circuit common or ground 104 thus disabling the bipolar effects of NFET transistor 78 and maintaining a charge on shared node 84 during the pre-charging phase of dynamic logic circuits. In response to a clock signal (CLK) transistor 76 pre-charges shared node 84. Node 84 is shared by the drain terminals of transistors 78, 86, 92 and 98 of transistor stacks 116, 118, 120 and 122, respectively. Logic inputs A and A1 are provided to the gate terminals of transistors 78 and 82 of stack 116, respectively, as illustrated in FIG. 3.

Similarly, stack 118 is comprised of transistors 86 and 90 that define another intermediate node 88 whereby pre-discharge transistor 110 provides a discharging path to circuit common 104. The pre-discharging function of transistor 110 disables the bipolar effects of NFET transistor 86, thus maintaining a charge on shared node 84. Logic inputs B and A1 are provided to gate terminals of transistors 86 and 90, respectively, as illustrated in FIG. 3.

Stack 120 is comprised of transistors 92 and 96 and define another intermediate node 94 whereby pre-discharge transistor 112 provides a discharging path to circuit common 104. The pre-discharging function of transistor 112 disables the bipolar effects of NFET transistor 92, thus maintaining a charge on shared node 84. Logic inputs A and B1 are provided to gate terminals of transistors 92 and 96, respectively, as illustrated in FIG. 3.

Stack 122 is comprised of transistors 98 and 102 and define another intermediate node 100 whereby pre-discharge transistor 114 provides a discharging path to circuit common 104. The pre-discharging function of transistor 114 disables the bipolar effects of NFET transistor 98, thus and maintaining a charge on shared node 84. Logic inputs B and B1 are provided to gate terminals of transistors 86 and 90, respectively, as illustrated in FIG. 3.

Dynamic logic circuit 74 implements the following logic function:

$$OUT=NOT\{(A*A1)+(A*B1)+(B*A1)+(B*B1)\}$$

whereby the NOT function, a logical inversion of the signal appearing at shared node 84, is implemented by inverter 106.

The CLK input is tied to a PFET 76 through its gate input terminal. When the input CLK signal is active low, PFET 76 turns on and charges shared drain node 84 to a high potential. This is referred to as the pre-charge phase in dynamic logic circuits. During the pre-charge phase inputs A, A1, B and B1 are set to logic low states. During the logic low state, PFETs 108, 110, 112 and 114 turn on and conduct current from intermediate nodes 80, 88, 94 and 100, respectively, to the dynamic circuit's common node 104 or ground potential. During the pre-charge phase, PFETs 108, 110, 112 and 114 actively discharge intermediate nodes 80, 88, 94 and 100, respectively. These intermediate modes are defined by stacked transistors 116, 118, 120 and 122, respectively. Accordingly, the bodies of NFETs 78, 82, 86, 90, 92, 96, 98 and 102 cannot charge to a high potential. Therefore, the parasitic bipolar transistors in parallel with these NFETs cannot activate because a sufficient amount of charge cannot build up in the bodies of these transistors to generate an adequate amount of base current to flow into the base of the parasitic bipolar transistors. By preventing the parasitic bipolar transistors from activating, the charge on the shared drain node 84 is protected from being unintentionally discharged.

As well as providing for the elimination of bipolar parasitic leakage current, PFET pre-discharging intermediate nodes 80, 88, 94 and 100 also improves the noise immunity of expanded stack dynamic logic circuit by increasing the threshold voltage, Vt, of NFET transistors 78, 86, 92 and 98. The Vt of NFETs 78, 86, 92 and 98 is higher when PFET pre-discharging transistors 108, 110, 112 and 114, respectively, are present in expanded stack dynamic logic circuit 74. The higher Vt increases the noise rejection of transistors 78, 86, 92 and 98. In other words, a higher magnitude of electrical noise voltage occurring at the respective gate terminals of NFETs 78, 86, 92 and 98, is required to cause false switching in expanded stack dynamic logic circuit 74.

In MOS FET transistors Vt is the threshold voltage at which point the transistor begins conducting current between the drain terminal and the source terminal, i.e. turns on. Accordingly, increasing the Vt increases the threshold at which the MOS FET transistor turns on. Therefore, a greater magnitude of spurious electrical noise voltage at the gate terminals is required to turn the MOS FET transistor on, thus causing a false switching of the dynamic logic circuit.

Figure 5:
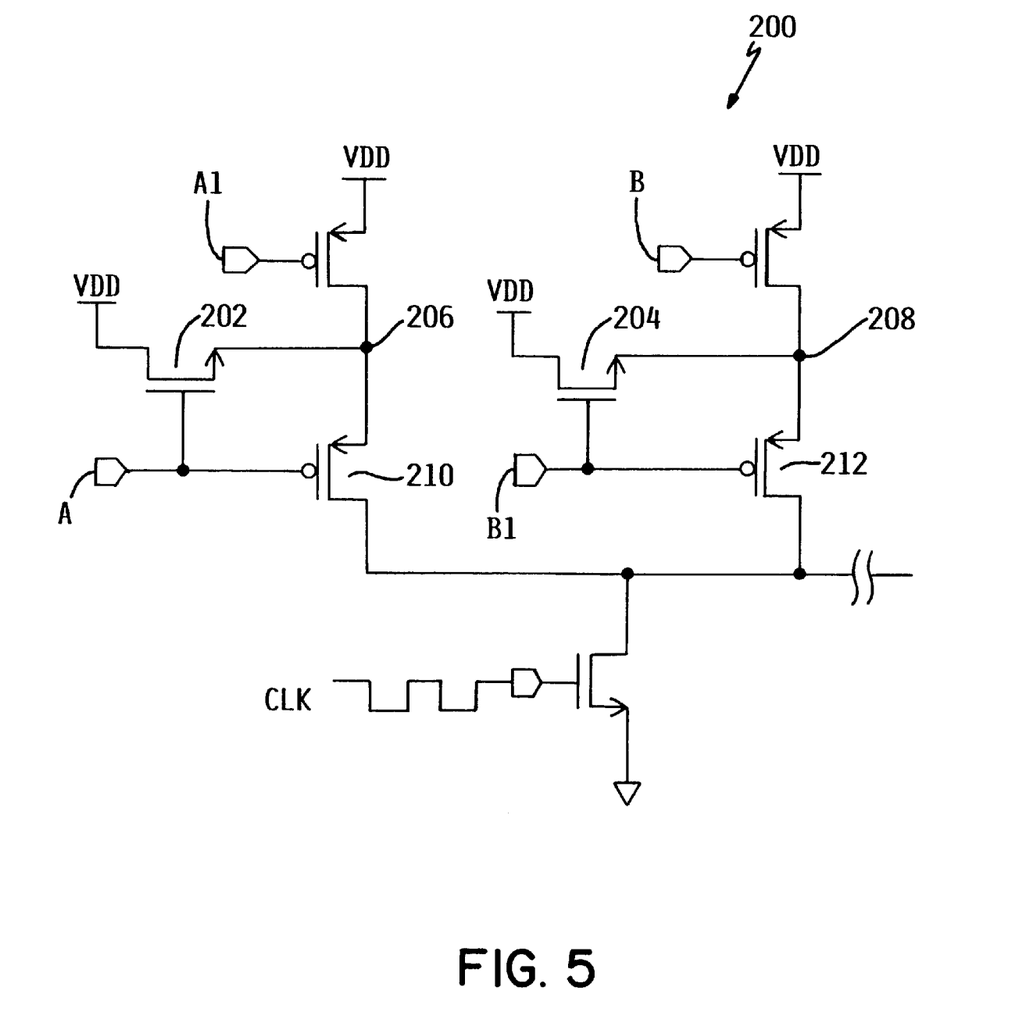
FIG. 5 is a schematic diagram of a portion of a dynamic circuit stack expansion methodology to eliminate the sneak current discharging path using NFET pre-charging devices.

It will also be appreciated by those skilled in the art that, given the symmetry of the FET devices, similar results could be achieved if the stacks were replaced with PFETs and the active discharging transistors were replaced with NFETs and interconnected to perform the function of pre-charging intermediate nodes 80, 88, 94 and 100 of the transistor stacks. FIG. 5 illustrates a portion of one embodiment of a dynamic circuit stack expansion methodology in accordance with the principles of the present invention utilizing NFET transistors 202 and 204 to pre-charge intermediate nodes 206 and 208, respectively, of dynamic logic circuit 202.

Greater noise immunity in expanded stack dynamic logic circuit 200 is achieved by utilizing NFET transistors 202 and 204 to pre-charge intermediate nodes 206 and 208, respectively. The NFET pre-charging transistors 202 and 204 increase the absolute value of the threshold voltage, Vt, of PFET transistors 210 and 212, respectively, thus improving the noise rejection capability of dynamic logic circuit 200.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A Silicon on Insulator (SOI) Metal Oxide Semiconductor (MOS) dynamic logic circuit for implementing a logic function, comprising:

a shared node providing an input to an output device of said dynamic logic circuit;

a plurality of stacks connected in parallel with one another and between said shared node and a common discharge potential to perform a predetermined logic function, each stack comprising a respective plurality of stacked SOI MOS devices and at least one intermediate node; and a respective active discharging device interconnected between each said intermediate node and said common discharge potential, each said active discharging device being controlled by a corresponding input to a respective one of said stacked SOI MOS devices to discharge the corresponding intermediate node to said common discharge potential;

wherein said plurality of stacked SOI MOS devices are arranged so as to eliminate any parasitic bipolar transistor current leakage path.

2. The dynamic logic circuit according to claim 1, wherein said bipolar current leakage path is eliminated by isolating said intermediate nodes one from the other.

3. The dynamic logic circuit according to claim 1, further comprising a pre-charging device coupled to said dynamic logic circuit.

4. The dynamic logic circuit according to claim 3, wherein said pre-charging device is coupled to said shared node.

5. The dynamic logic circuit according to claim 4 wherein said pre-charging device is a Field Effect Transistor.

6. The dynamic logic circuit according to claim 1, wherein each said stacked SOI MOS device is coupled to a respective corresponding logic input.

7. The dynamic logic circuit according to claim 1, wherein said dynamic logic circuit is an expanded stack circuit.

8. The dynamic logic circuit according to claim 7, wherein the predetermined logic function implemented by said expanded stack circuit is determined by $$\text{OUT}=\text{NOT}\{(A*A1)+(A*B1)+(B*A1)+(B*B1)\}$$

where OUT is the predetermined logic function output and A, B, A1 and B1 are inputs to said expanded stack circuit.

9. The dynamic logic circuit according to claim 1 wherein the SOI MOS electronic devices further comprise transistors.

10. The dynamic logic circuit according to claim 9 wherein said transistors are N type Field Effect Transistors (NFET).

11. The dynamic logic circuit according to claim 9 wherein said transistors are P type Field Effect Transistors (PFET).

12. The dynamic logic circuit according to claim 9 wherein each said stack comprises:

a first transistor having a body, a drain terminal, a source terminal, and a gate input terminal;

a second transistor having a body, a drain terminal, a source terminal, and a gate input terminal; and said first and second transistors being operatively coupled.

13. The dynamic logic circuit according to claim 12 wherein said source terminal of said first transistor is coupled to said drain terminal of said second transistor defining one of said intermediate nodes.

14. The dynamic logic circuit according to claim 13 wherein said active discharging device is a transistor having a drain operatively coupled to said defined intermediate node;

a gate operatively coupled to said gate input terminal; and a source operatively coupled to said common discharge voltage.

15. The dynamic logic circuit according to claim 14 wherein said transistors are N type Field Effect Transistors (NFET) and said active discharging device is a P type Field Effect Transistors (PFET).

16. The dynamic logic circuit according to claim 14 wherein said transistors are P type Field Effect Transistors (PFET) and said active discharging device is a N type Field Effect Transistors (NFET).

17. A Silicon on Insulator (SOI) Metal Oxide Semiconductor (MOS) dynamic logic circuit for implementing a logic function, comprising:

a precharge node which is precharged during a precharge phase of a clock, said precharge node being coupled to an output device for outputting a logic value of said dynamic logic circuit;

a plurality of parallel stacks connected between said precharge node an a common discharge potential to perform a predetermined logic function, each stack comprising a respective plurality of SOI MOS devices connected in series and providing a logic path from said precharge node to said common discharge potential, each stack further comprising at least one intermediate node; and a respective active discharging device interconnected between each said intermediate node and said common discharge potential, said active discharging device selectively discharging said intermediate node to said common discharge potential to prevent parasitic bipolar transistor action.

18. The dynamic logic circuit of claim 17, wherein each said active discharge device is a field effect transistor, wherein the source of the field effect transistor is coupled to said common discharge potential, the drain of said field effect transistor is coupled to said intermediate node, and the gate of said field effect transistor is coupled to an input to a corresponding SOI MOS device in the stack being discharged by the active discharge device.

* * * * *